United States Patent
Shiromoto et al.

(10) Patent No.: US 9,575,365 B2
(45) Date of Patent: Feb. 21, 2017

(54) LIQUID CRYSTAL DISPLAY DEVICE AND MANUFACTURING METHOD THEREOF

(71) Applicants: Japan Display Inc., Tokyo (JP); Panasonic Liquid Crystal Display Co., Ltd., Hyogo-ken (JP)

(72) Inventors: Tomoyuki Shiromoto, Chiba (JP); Toshirou Iwata, Chosei (JP); Rai Yang, Chiba (JP); Shinichi Soto, Mobara (JP)

(73) Assignees: Japan Display Inc., Tokyo (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 0 days.

(21) Appl. No.: 14/986,528

(22) Filed: Dec. 31, 2015

(65) Prior Publication Data

US 2016/0116771 A1 Apr. 28, 2016

Related U.S. Application Data

(63) Continuation of application No. 13/966,823, filed on Aug. 14, 2013, now Pat. No. 9,257,458, which is a (Continued)

(30) Foreign Application Priority Data

Jan. 15, 2010 (JP) ................................ 2010-007068

(51) Int. Cl.
*G02F 1/133* (2006.01)
*G02F 1/1337* (2006.01)
(Continued)

(52) U.S. Cl.
CPC ........... *G02F 1/1337* (2013.01); *G02F 1/1339* (2013.01); *G02F 1/1368* (2013.01);
(Continued)

(58) Field of Classification Search
CPC .............. G02F 1/1337; G02F 1/133512; G02F 1/133514; G02F 1/133753; G02F 1/1339; G02F 1/134336; G02F 1/134363; G02F 1/13471; G02F 1/1368; H01L 27/1292
See application file for complete search history.

(56) References Cited

U.S. PATENT DOCUMENTS 5,877,836 A 3/1999 Miura et al.
7,880,846 B2 * 2/2011 Motomatsu ........... G02F 1/1337
349/123

(Continued)

FOREIGN PATENT DOCUMENTS

JP 2008-145461 A 6/2008
JP 2008-281991 A 11/2008

*Primary Examiner* — James Dudek
(74) *Attorney, Agent, or Firm* — Typha IP LLC

(57) ABSTRACT

A method of manufacturing a liquid crystal display device including a TFT substrate with display and peripheral regions. The display region has pixels each having a pixel electrode and a TFT. A counter substrate opposes the TFT substrate and has a color filter formed at a position corresponding to a position at which the pixel electrode is formed above the TFT substrate. The method includes coating, outside of the display region of the TFT substrate, a second alignment film in the shape of a frame, and coating, in the display region, a first alignment film that dries more slowly than the second alignment film. The first and second alignment films are in contact, and the second alignment film is thicker than the first alignment film.

6 Claims, 6 Drawing Sheets

Related U.S. Application Data continuation of application No. 13/004,056, filed on Jan. 11, 2011, now Pat. No. 8,514,356.

(51) Int. Cl.
| | | |
|---|---|---|
| *H01L 27/12* | (2006.01) | |
| *G02F 1/1335* | (2006.01) | |
| *G02F 1/1339* | (2006.01) | |
| *G02F 1/1343* | (2006.01) | |
| *G02F 1/1347* | (2006.01) | |
| *G02F 1/1368* | (2006.01) | |
| *G02F 1/1333* | (2006.01) | |

(52) U.S. Cl.
CPC .... *G02F 1/13471* (2013.01); *G02F 1/133512* (2013.01); *G02F 1/133514* (2013.01); *G02F 1/133753* (2013.01); *G02F 1/134336* (2013.01); *G02F 1/134363* (2013.01); *H01L 27/1292* (2013.01); *G02F 2001/133388* (2013.01)

(56) References Cited

U.S. PATENT DOCUMENTS

| | | |
|---|---|---|
| 8,233,119 B2 | 7/2012 | Gotoh |
| 2001/0005257 A1* | 6/2001 | Yamada ............ G02F 1/133512 349/158 |
| 2008/0137022 A1 | 6/2008 | Komeno et al. |

* cited by examiner

LIQUID CRYSTAL DISPLAY DEVICE AND MANUFACTURING METHOD THEREOF

CROSS-REFERENCE TO RELATED APPLICATION

This application is a continuation of U.S. patent application Ser. No. 13/966,823, filed on Aug. 14, 2013, which, in turn, is a continuation application of U.S. patent application Ser. No. 13/004,056 (now, U.S. Pat. No. 8,514,356), filed on Jan. 11, 2011, which claims the benefit of priority from Japanese Patent Application No. 2010-007068, filed on Jan. 15, 2010 in the Japanese Patent Office, the entire contents of which are incorporated herein by reference.

CLAIM OF PRIORITY

The present application claims priority from Japanese Patent Application JP 2010-007068 filed on Jan. 15, 2010, the content of which is hereby incorporated by reference into this application.

BACKGROUND OF THE INVENTION

1. Field of the Invention

The present invention relates to a display device. The invention particularly relates to a liquid crystal display device that can be formed as a so-called narrow frame type in which a display region is made larger relative to a predetermined outer shape.

2. Description of the Related Art

A liquid crystal display device has a TFT substrate and a counter substrate opposed to the TFT substrate. The TFT substrate includes pixels arranged in a matrix, each pixel having a pixel electrode and a thin film transistor (TFT). The counter substrate includes a color filter formed at a position corresponding to a position at which the pixel electrode is located above the TFT substrate. Liquid crystals are put between the TFT substrate and the counter substrate. Images are formed by controlling the light transmittance of liquid crystal molecules for every pixel.

Since liquid crystal display devices are flat in shape and light in weight, their uses have been extended in various fields. Small-sized liquid crystal display devices have been used generally, for example, in mobile phones or DSC (Digital Still Camera), etc. For the small-sized liquid crystal display devices, there is a strong demand to enlarge a display region while keeping the outer shape of the device small. Then, the width between the end of the display region and the end of the liquid crystal display device becomes narrow and so it is necessary to provide a so-called narrow frame.

A seal member for bonding the TFT substrate and the counter substrate is applied to a narrow frame region. On the other hand, an alignment film for initial alignment of liquid crystals is formed in the display region of the liquid crystal display device. Since it is necessary that the alignment film cover the display region reliably, the area to coat the alignment film has to be larger by a predetermined width than that of the display region. On the other hand, when the alignment film is present between the seal member and the TFT substrate or between the seal member and the counter substrate, the reliability of bonding by the seal member will deteriorate. Accordingly, the alignment film should not overlap with the seal member. Even if the alignment film and the seal member overlap each other, it is necessary that the overlapping region extend not over the entire surface thereof but partially.

The alignment film has been formed by flexographic printing. Since, in the flexographic printing, the viscosity of the alignment film before baking can be made higher, the outer shape of the alignment film can be controlled accurately. On the other hand, the market recently requires various types of sizes for the liquid crystal display devices. When the flexographic printing is used, the printing plates have to be prepared for every size, resulting in problems in the manufacturing cost of the printing plates and the number of steps in the line of exchange the printing plates.

Manufacturing the alignment film by ink jet printing may cope with manufacture of liquid crystal display devices of various types and various sizes. However, when the alignment film is to be formed by ink jet printing, it is necessary to lower the viscosity of the alignment film. However, if the viscosity of the alignment film is low, the alignment film flows out to the outside after coating of the alignment film, thus making it difficult to accurately control the outer shape of the alignment film.

JP-A-2008-145461 describes that unevenness is formed at the periphery of an under layer film forming the alignment film to use the unevenness as a stopper when the alignment film flows to the outside after coating.

SUMMARY OF THE INVENTION

In the technique described in JP-A-2008-145461, unevenness is formed at the periphery of an insulating film carrying an alignment film thereon, that is, in the vicinity of a seal portion. Then, ITO (Indium Tin Oxide) formed simultaneously with a pixel electrode is disposed to a portion of the insulating film where the unevenness is formed, thereby preventing the alignment film from flowing out to the outside.

However, this method is disadvantageous in that when the alignment film is filled fully in the concave portion formed at the periphery of the insulating film, the alignment film further flows out to the outside. The ITO film is formed in the concave portion at the periphery of the insulating film; however since the thickness of the ITO film is, for example, 70 nm or less, it is difficult for the ITO film to function as stopper having a sufficient height.

Further, although the configuration in JP-A-08-145461 can be applied on the side of the TFT substrate, disadvantageously it is not applicable on the side of the counter substrate since the film configuration on the side of the counter electrode is different from that on the side of the TFT substrate.

The present invention intends to provide a narrow frame type liquid crystal display device with high reliability when an alignment film is formed by ink jet printing, by preventing the alignment film from flowing out to the outside thereby accurately controlling the outer shape of the alignment film.

The present invention overcomes the problems described above and provides the following specific embodiments.

(1) According to a first aspect of the present invention, there is provided a liquid crystal display device including a TFT substrate having a display region and a peripheral region, the display region having pixels arranged in a matrix, each pixel having a pixel electrode and a TFT; and a counter substrate opposed to the TFT substrate, the counter substrate having a color filter formed at a position corresponding to a position at which the pixel electrode is formed above the TFT substrate, the TFT substrate being bonded to the counter substrate by way of a seal member in a seal portion located at the periphery, wherein a first alignment film is formed in the display region of the TFT substrate, and a second alignment film is formed at the peripheral region outside of the display region and at the outside of the first alignment film, the second alignment film being not formed in the display region, and wherein the first alignment film is in contact with the second alignment film.

(2) A liquid crystal display device as described in (1) above, wherein the thickness of the second alignment film is larger than the thickness of the first alignment film.

(3) A liquid crystal display device as described in (1) above, wherein the second alignment film is in contact with the seal member.

(4) According to a second aspect of the present invention, there is provided a liquid crystal display device including a TFT substrate having a display region and a peripheral region, the display region having pixels arranged in a matrix, each pixel having a pixel electrode and a TFT; and a counter substrate opposed to the TFT substrate, the counter substrate having a color filter formed at a position corresponding to a position at which the pixel electrode is formed above the TFT substrate, the counter substrate having a display region and a peripheral region, the TFT substrate being bonded to the counter substrate by way of a seal member in a seal portion located at the periphery, wherein a first alignment film is formed in the display region of the TFT substrate, and a second alignment film is formed at the peripheral region outside of the display region and at the outside of the first alignment film, the second alignment film being not formed in the display region, the first alignment film being in contact with the second alignment film; and wherein a first alignment film is formed in the display region of the counter substrate, a second alignment film is formed at the peripheral region outside of the display region and at the outside of the first alignment film, the second alignment film is not formed in the display region, and the first alignment film is in contact with the second alignment film.

(5) A liquid crystal display device as described in (4) above, wherein the thickness of the second alignment film is larger than the thickness of the first alignment film.

(6) According to a third aspect of the present invention, there is provided a method of manufacturing a liquid crystal display device including a TFT substrate having a display region and a peripheral region, the display region having pixels arranged in a matrix, each pixel having a pixel electrode and a TFT; and a counter substrate opposed to the TFT substrate, the counter substrate having a color filter formed at a position corresponding to a position at which the pixel electrode is formed above the TFT substrate, the TFT substrate being bonded to the counter substrate by way of a seal member in a seal portion located at the periphery, the method comprising the steps of:

coating at the periphery outside of the display region of the TFT substrate, by ink jet printing, a second alignment film in the shape of a frame, and then coating in the display region, by ink jet printing, a first alignment film drying more slowly than the second alignment film such that first alignment film is in contact with the second alignment film.

(7) According to a fourth aspect of the present invention, there is provided method of manufacturing a liquid crystal display device including a TFT substrate having a display region and a peripheral region, the display region having pixels arranged in a matrix, each pixel having a pixel electrode and a TFT; and a counter substrate opposed to the TFT substrate, the counter substrate having a color filter formed at a position corresponding to a position at which the pixel electrode is formed above the TFT substrate, the counter substrate having a display region and a peripheral region, the TFT substrate being bonded to the counter substrate by way of a seal member in a seal portion located at the periphery, the method comprising the steps of:

coating at the periphery outside of the display region of the TFT substrate, by ink jet printing, a second alignment film in the shape of a frame, and then coating in the display region, by ink jet printing, a first alignment film drying more slowly than the second alignment film such that first alignment film is in contact with the second alignment film, coating at the periphery outside of the display region of the counter substrate, by ink jet printing, a second alignment film in the shape of a frame, then coating in the display region of the counter substrate, by ink jet printing, a first alignment film drying more slowly than the second alignment film such that the first alignment film is in contact with the second alignment film, and then bonding the TFT substrate and the counter substrate by way of a seal member.

According to the present invention, the outer shape of the alignment film can be controlled accurately even when the alignment film is formed by ink jet printing. Accordingly, a liquid crystal display device of a narrow frame can be manufactured reliably and at a low cost.

DETAILED DESCRIPTION OF THE PREFERRED EMBODIMENTS

The present invention is to be described specifically by way of the following embodiments.

First Embodiment

Figure 1:
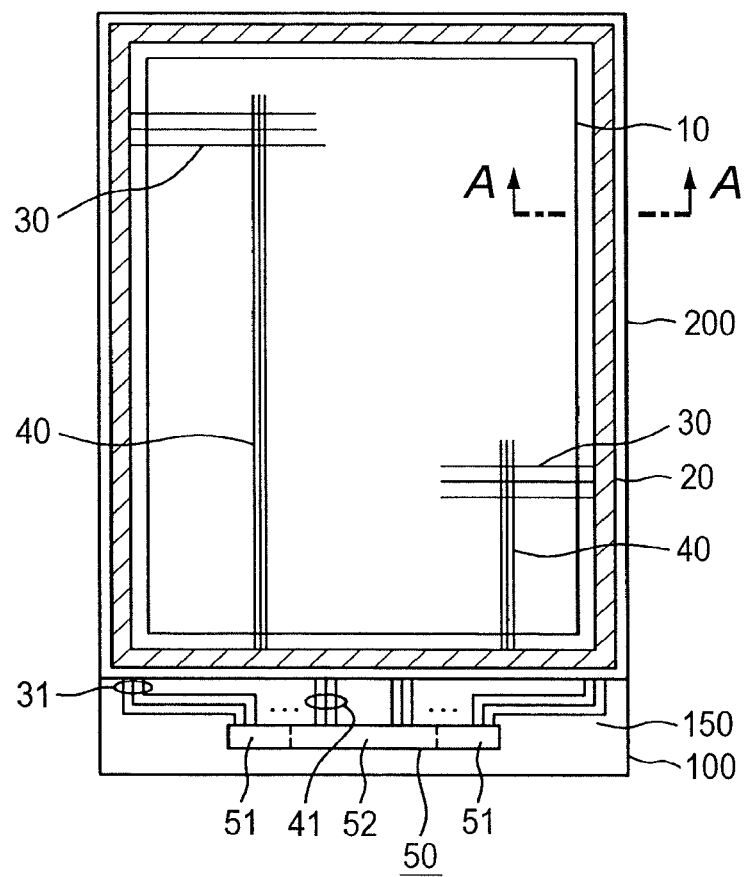
FIG. 1 is a plan view of a liquid crystal display device to which the present invention is applied.

FIG. 1 is a plan view of a small-sized liquid crystal display device used for a mobile phone or the like which is an example of a product to which the invention is applied. In FIG. 1, a counter substrate 200 is disposed above a TFT substrate 100. A liquid crystal layer not illustrated is put between the TFT substrate 100 and the counter substrate 200. The TFT substrate 100 and the counter substrate 200 are bonded by a seal member 20 formed at a frame portion. In FIG. 1, since liquid crystals are sealed by one drop filling method, a sealing hole is not formed.

The TFT substrate 100 is formed larger than the counter substrate 200. A terminal portion 150 for supplying power, video signals, scanning signals, etc. to a liquid crystal display panel is formed at a portion by which the TFT substrate 100 is made larger than the counter substrate 200.

Further, an IC driver 50 for driving a scanning signal lines 30, video signal lines 40, etc. is disposed to the terminal portion 150. The IC driver 50 is divided into three regions in which a video signal driving circuit 52 is disposed at the central portion and scanning signal driving circuits 51 are disposed on both sides thereof.

In a display region 10 in FIG. 1, scanning signal lines 30 extend in the lateral direction and are arranged in the vertical direction. Further, video signal lines 40 extend in the vertical direction and are arranged in the lateral direction. Regions each surrounded by the scanning signal lines and the video signal lines define a pixel. The scanning signal lines 30 are connected from opposite sides of the display region 10 by way of scanning signal line leads 31 to the scanning signal driving circuits 51 of the IC driver 50. Video signal line leads 41 that connect the video signal line 40 and the IC driver 50 are gathered on the lower side of a screen and connected with the video signal driving circuit 52 disposed in the central portion of the IC driver 50.

In FIG. 1, the display region 10 is completely covered by an alignment film not illustrated. The alignment film is formed by ink jet printing. However, as described later, the alignment film does not overlap with the seal member 20, or even if they overlap each other, the alignment film only partially overlaps with the seal member 20 but does not overlap with the entire surface of the seal member 20. Then, while the alignment film is formed by ink jet printing, a narrow frame can be attained as the distance from the end of the display region 10 to the end of the liquid crystal display device is about 1.5 mm.

Figure 2:
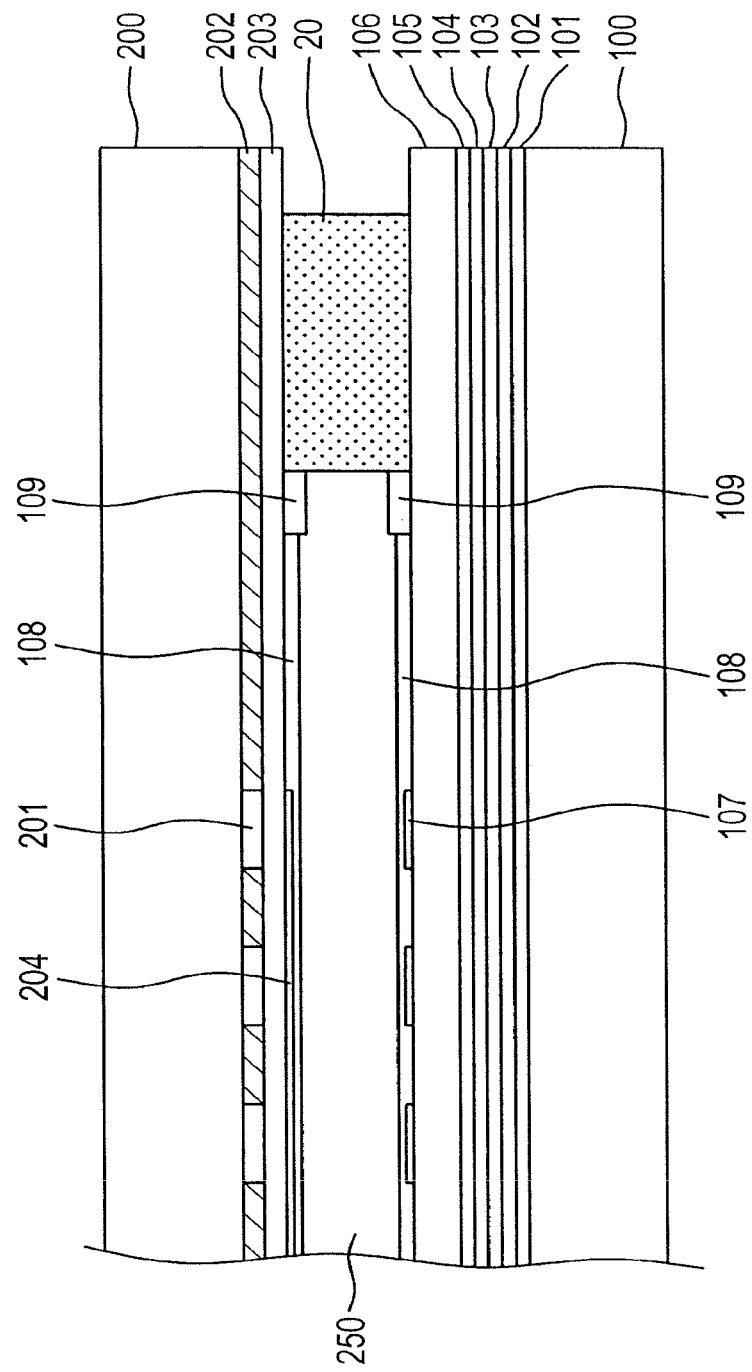
FIG. 2 is a cross-sectional view along line A-A in FIG. 1.

FIG. 2 is a cross-sectional view along line A-A in FIG. 1. FIG. 2 is an example of a so-called TN type liquid crystal display device in which pixel electrodes 107 are formed above the TFT substrate 100 and a counter electrode 204 is formed above the counter substrate 200. The invention is applicable not only to the TN type but also to liquid crystal display devices such as an IPS (In Plane Switching) type, in which pixel electrodes and counter electrodes are formed on the side of the TFT substrate 100. Further, while FIG. 2 shows a structure based on a so-called top gate type TFT in which poly-Si is often used for a semiconductor layer, the invention is applicable in the same manner also to the case of a so-called bottom gate type TFT in which a-Si is often used for the semiconductor layer.

In FIG. 2, above the TFT substrate 100 are formed a first underlayer film 101, a second underlayer film 102, a gate insulating film 103, an interlayer insulating film 104, an inorganic passivation film 105, and an organic passivation film 106 that also functions as a planarizing film, in this order. The first underlayer film 101 and the second underlayer film 102 are used for preventing impurities deposited from a glass substrate from contaminating a not illustrated semiconductor layer in the display region 10. The gate insulating film 103 is used for insulating a not illustrated gate electrode and the semiconductor layer, and the interlayer insulating film 104 is used for insulating the gate electrode or a scanning line 30 and a source/drain electrode or a video signal line 40. The inorganic passivation film 105 protects a not illustrated TFT in the display region 10 and the organic passivation film 106 has a function as a passivation film, as well as a function of planarizing the unevenness on the surface caused by TFTs or wirings.

Pixel electrodes 107 are formed above the planar organic passivation film 106 in the display region 10. A display region alignment film 108 is formed to cover the pixel electrodes 107 in the display region 10. It is necessary that the display region alignment film 108 cover the entire display region 10 reliably.

At the outside of the display region 10, a peripheral alignment film 109 is formed above the organic passivation film 106. The display region alignment film 108 is formed also at the outside of the display region 10 in order to reliably cover the display region 10. The peripheral alignment film 109 has a role of accurately defining, as a stopper, the coating region of the alignment film, thereby preventing the display region alignment film 108 from spreading to the periphery. As described above, the invention has a feature in using two types of alignment films, that is, the display region alignment film 108 and the peripheral alignment film 109. In the seal portion, the seal member 20 is formed directly on the organic passivation film 106.

In FIG. 2, a color filter 201 and a black matrix 202 are formed in the display region 10 of the counter electrode 200, and the black matrix 202 is formed at the outside of the display region 10. An overcoat film 203 is formed to cover the color filter 201 and the black matrix 202. The overcoat film 203 has a role of preventing the effect of the color filter 201 on the liquid crystal layer 250 and planarizing the surface of the color filter 201 and the black matrix 202.

The counter electrode 204 made of ITO is formed in a solid coating above the overcoat film 203. Then, in the display region 10, the display region alignment film 108 is formed to cover the counter electrode 204. Further, the peripheral alignment film 109 is formed at the outside of the display region 10. The peripheral alignment film 109 has a role of accurately defining, as a stopper, the coating region of the alignment film, thereby preventing the display region alignment film 108 from spreading to the periphery.

A liquid crystal layer 250 is put between the TFT substrate 100 and the counter electrode 204. The liquid crystal layer 250 is sealed by the seal member 20 formed at the periphery of the TFT substrate 100 and the counter electrode 204. The seal member 20 is in direct contact with the organic passivation film 106 in the TFT substrate 100 and is in direct contact with the overcoat film 203 in the counter substrate 200 and, usually, the alignment film is not present therebetween.

In FIG. 2, while the peripheral alignment film 109 is formed to have a narrow width, the thickness thereof is larger than the thickness of the display region alignment film 108. The peripheral alignment film 109 prevents the display region alignment film 108 from spreading to the periphery, thereby preventing the alignment film from being formed below the seal member 20. Accordingly, the seal portion of the invention has high bonding reliability.

Figure 3:
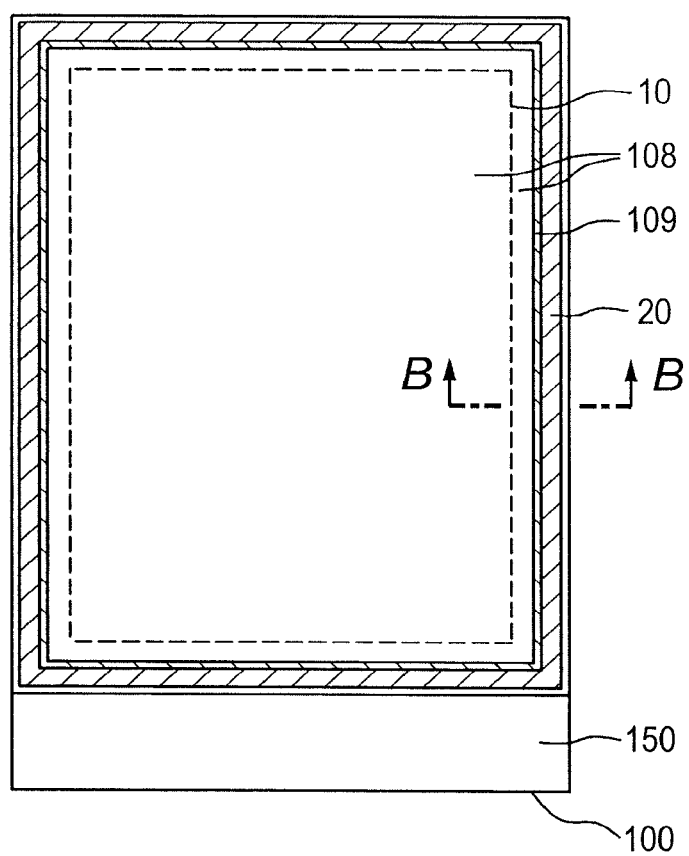
FIG. 3 is a plan view of a TFT substrate according to the invention.

FIG. 3 is a plan view only for the TFT substrate 100 in FIG. 1. In FIG. 3, the seal member 20 is formed at the periphery of the TFT substrate 100. The seal member 20 is often formed above the counter substrate 200 in the manufacturing process. FIG. 3 shows a region in which the seal member 20 presents. The peripheral alignment film 109 is formed in contact with the inside of the seal member 20.

The peripheral alignment film 109 is shown such that it is in contact with the inside of the seal member 20. However, there may be actually a case where a slight gap is formed between the peripheral alignment film 109 and the seal member 20 or a case where the peripheral alignment film 109 slightly overlaps with the seal member 20 depending on the variation in the manufacture. Even in the case where the peripheral alignment film 109 overlaps with the seal member 20, since the amount of overlap is slight, this scarcely affects on the reliability of the seal portion. In FIG. 3, the display region alignment film 108 covers the entire area of the display region 10 and is in contact with the inside of the peripheral alignment film 109.

Figure 4:
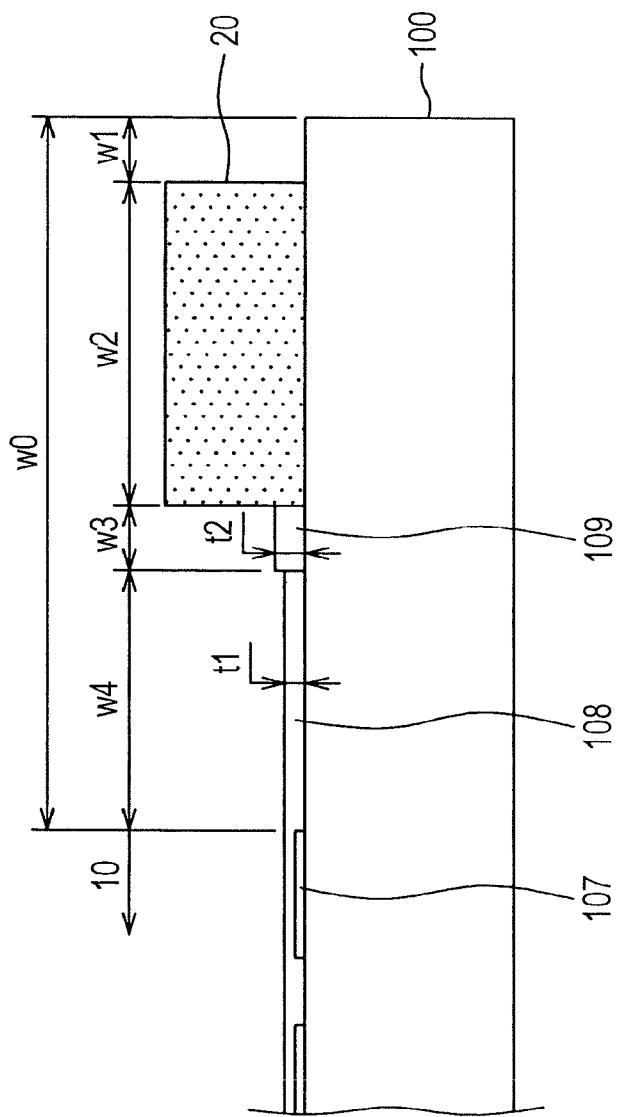
FIG. 4 is a cross-sectional view of an end portion of a TFT substrate according to the invention.

FIG. 4 is a cross-sectional view along line B-B in FIG. 3. In FIG. 4, layers at or lower than the organic passivation film 106 below the pixel electrodes 107 in the TFT substrate 100 are not illustrated. FIG. 4 shows an example for respective dimensions at the periphery. In FIG. 4, the distance w0 from the end of the display region 10 to the end of the TFT substrate 100 is 1.5 mm, to form a narrow frame.

In FIG. 4, the size w1 from the end of the TFT substrate 100 to the end of the seal member 20 is 0.2 mm. The size w1 is a necessary size when each of the liquid crystal cells is separated from a mother substrate 500 by scribing. This is because each of the liquid crystal cells cannot be separated when the scribing line is present inside the seal member 20.

In FIG. 4, the width w2 of the seal member 20 is about 0.7 mm. The size is necessary for keeping the reliability of bonding. A peripheral alignment film 109 is formed in contact with the seal member 20. The width w3 of the peripheral alignment film 109 is 0.2 mm. While a smaller size is more preferred for the width of the peripheral alignment film 109, it is defined as about 0.2 mm since the film is coated by ink jet printing. The width w3 can be changed according to the drying speed of the ink for the peripheral alignment film 109.

In FIG. 4, the distance w4 from the end of the display region 10 to the end of the peripheral alignment film 109 is 0.4 mm. In other words, the coating range for the display region alignment film 108 can be made larger than the display region 10 by about 0.4 mm on one side. When the display region alignment film 108 is coated, since the peripheral alignment film 109 has already been dried and solidified, the peripheral alignment film 109 can function as a stopper to the display region alignment film 108.

The invention has a feature in forming two types of the alignment films. That is, the quick drying peripheral alignment film 109 is formed at the outside of the display region 10 and the display region alignment film 108 is formed in the display region 10 and between the display region 10 and the peripheral alignment film 109. To form the alignment films by ink jet printing, it is necessary to eliminate the unevenness of the films by a leveling effect after coating the alignment films. However, when the alignment film dries quickly, the leveling effect is not provided sufficiently.

However, if the drying speed of the alignment film is made slower for obtaining the leveling effect, this results in a problem that the alignment film spreads to the periphery, thereby making the control for the outer shape of the alignment film difficult. That is, in the ink jet system, uniformity of the alignment film and accurate control of the outer shape of the alignment film are in a trade-off relation. According to the invention, the quick drying peripheral alignment film 109 is formed in the frame shape at the periphery of the display region 10 and the outer shape of the display region alignment film 108 is controlled accurately by the peripheral alignment film 109.

A process for forming the alignment films by ink jet printing in the present invention is as described below. That is, the display region alignment film 108 is first coated by ink jet printing. Since the ink for the peripheral alignment film 109 dries quickly, it is solidified at a predetermined width and a thickness before the spreading of the alignment film. The width w3 of the peripheral alignment film 109 can be controlled to about 0.2 mm and the thickness t2 thereof can be made to 100 nm or more.

Successively, the display region alignment film 108 is coated by ink jet printing. It is necessary that a leveling effect be caused sufficiently in the display region alignment film 108 to such an extent that the unevenness of the alignment film can be eliminated. For this purpose, it is necessary that the drying speed of the alignment film be slow. When the drying speed of the alignment film is slow, the alignment film tends to spread to the periphery. Therefore, control for the outer shape of the alignment film by the ink jet printing has been difficult so far.

In the invention, since the peripheral alignment film 109 is formed, then dried and solidified at the instance the display region alignment film 108 is coated, the outer shape of the display region alignment film 108 is defined by the peripheral alignment film 109, and can be entirely controlled accurately. In order to obtain the effect described above, it is necessary that the peripheral alignment film 109 be formed to have a thickness t2 larger than the thickness t1 of the display region alignment film 108.

The thickness t1 of the display region alignment film 108 is about 100 nm. In contrast, even when the thickness t2 of the peripheral alignment film 109 is made larger than 100 nm, it is easy to keep the width w3 of the peripheral alignment film 109 to about 0.2 mm since the film dries quickly. Easy controllability for the width of the peripheral alignment film 109 means that the outer shape of the entire alignment film can be controlled. If the alignment film dries quickly, no sufficient leveling effect is obtained so that unevenness is formed on the film. However, since the peripheral alignment film 109 is formed at the outside of the display region 10, unevenness of the peripheral alignment film 109 does not give an undesired effect on the image quality.

Since the peripheral alignment film 109 and the display region alignment film 108 are coated separately, the boundary between the peripheral alignment film 109 and the display region alignment film 108 can be observed by a microscope as shown in FIG. 4. Further, since the thickness of the peripheral alignment film 109 is larger than the thickness of the display region alignment film 108, presence of the peripheral alignment film 109 and that of the display region alignment film 108 can also be distinguished in this regard.

While it has been described above that the peripheral alignment film 109 is coated and then the display region alignment film 108 is coated, the time interval from the coating of the peripheral alignment film 109 to the coating of the display region alignment film 108 can be changed variously in a range from an extremely short time to a relatively long time. The time interval from the coating of the peripheral alignment film 109 to the coating of the display region alignment film 108 is determined according to the extent of the drying speed of the peripheral alignment film 109.

In FIGS. 3 and 4, the configuration on the side of the TFT substrate 100 has been explained. However, the configuration of the alignment film described with reference to FIGS. 3 and 4 is applicable also to the side of the counter substrate 200. That is, while the film structure formed below the alignment film is different between the TFT substrate 100 and the counter substrate 200, a quite identical method of forming the alignment film can be applied to the TFT substrate 100 and the counter substrate 200.

Figure 5:
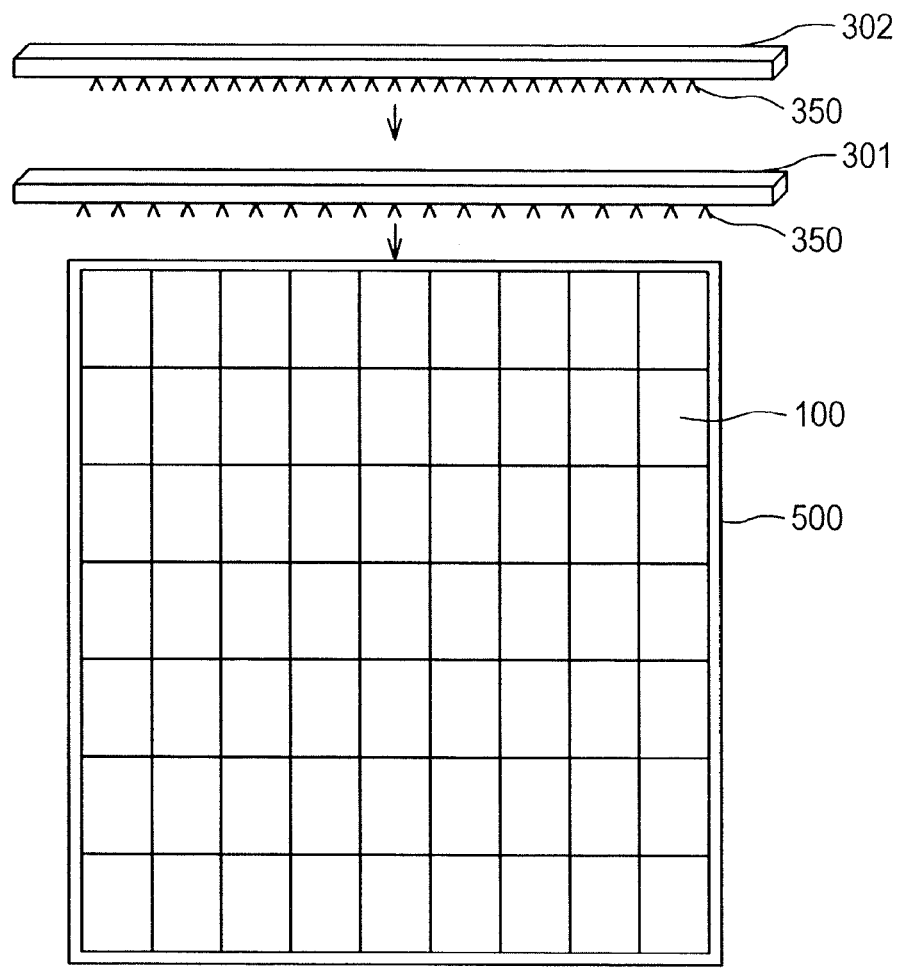
FIG. 5 shows an example of a method of forming an alignment film by ink jet printing.

FIG. 5 is a schematic view showing an example of a method of coating an alignment film in the invention. In FIG. 5, a plurality of TFT substrates 100 are formed on a mother substrate 500. That is, after completing the manufacturing process in the state of the mother substrate 500, it is bonded with a mother substrate formed with a plurality of counter substrates. Then, each of the liquid crystal cells is separated by scribing. Coating of the alignment film is also performed in the state of the mother substrate 500.

In FIG. 5, the peripheral alignment film 109 is coated by a first head 301, and a plurality of nozzles corresponding to the coating region are provided in the first head 301. The display region alignment film 108 is coated by a second head 302 and a plurality of nozzles corresponding to the coating region are provided in the second head 302. The positions for the nozzles are different between the first head 301 and the second head 302. FIG. 5 shows a state in which ink jet printing 350 for the alignment film is discharged from the nozzles of the first head and the second head.

In FIG. 5, the first head 301 first moves along an arrow to coat the peripheral alignment film 109. Since the peripheral alignment film 109 dries quickly, it is dried and solidified instantly after the coating. Successively, the second head 302 moves following after the first head 301 as shown by an arrow to coat the display region alignment film 108. To obtain the leveling effect sufficiently, the drying speed of the display region alignment film 108 is slow and the film tends to spread to the periphery after the coating. However, as shown in FIG. 4, since the peripheral alignment film 109 coated by the first head 301 has already been dried and solidified, the peripheral alignment film 109 serves as a stopper, so that the display region alignment film 108 spreads no more.

In FIG. 5, the time interval from the movement of the first head 301 to the movement of the second head 302 can be determined according to the drying speed of the peripheral alignment film 109. When the peripheral alignment film 109 dries quickly, the second head 302 can be moved immediately after the movement of the first head 301. In this case, even when two types of alignment films are coated, the tact time scarcely increases. It has been described for the mother substrate 500 on the side of the TFT substrate 100 in FIG. 5. However, it is possible to coat the peripheral alignment film 109 and the display region alignment film 108 also to a mother substrate 500 on the side of the counter substrate 200 in the same manner.

Figure 6:
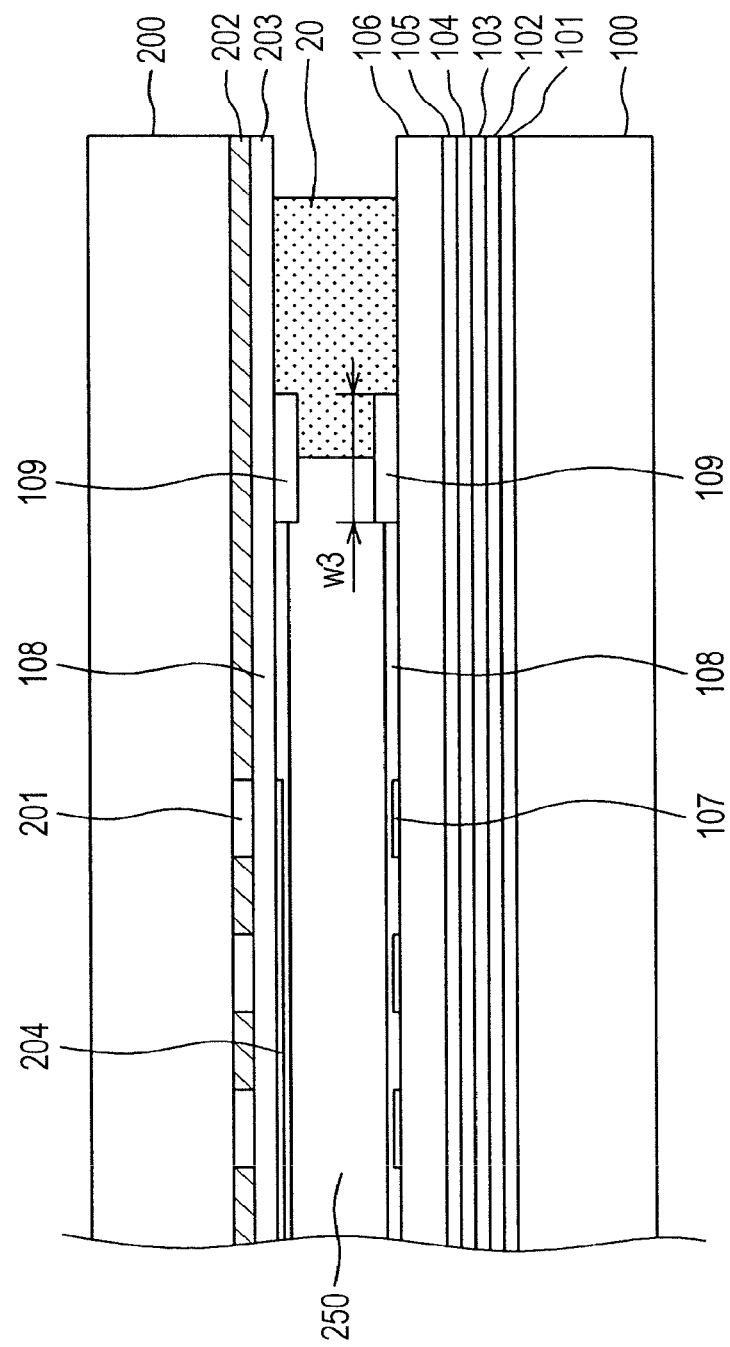
FIG. 6 shows another example of a liquid crystal display device according to the invention.

FIG. 6 is an example modified from that of FIG. 2. In FIG. 2, the width w3 of the peripheral alignment film 109 is made larger than that in FIG. 2 and the film 109 partially overlaps with the seal member 20. The allowance for the coating of the peripheral alignment film 109 can be increased by so much as the width w3 of the peripheral alignment film 109 is increased. Other structures in FIG. 6 are identical with those in FIG. 2.

In FIG. 6, the peripheral alignment film 109 partially overlaps with the seal member. However, since the amount of the overlap is small, this does not give any significant effect on the adhesion between the seal member 20 and the organic passivation film 106 in the TFT substrate 100 or on the adhesion between the seal member 20 and the overcoat film 203 in the counter substrate 200. As described above, even when the allowance for the coating of the peripheral alignment film 109 is made larger, the reliability of the seal portion at the periphery can be maintained.

In the explanations described above, it has been described that the display region alignment film 108 and the peripheral alignment film 109 are formed in the same manner above the TFT substrate 100 and the counter substrate 200. However, specific effects according to the invention can be obtained also when two types of alignment films are coated only to one of the TFT substrate 100 and the counter substrate 200 because of some or other situations.

The invention claimed is:

1. A liquid crystal display device including a TFT substrate having a display region and a peripheral region, the display region having pixels arranged in a matrix, each pixel having a pixel electrode and a TFT; and a counter substrate opposed to the TFT substrate, the counter substrate having a color filter formed at a position corresponding to a position at which the pixel electrode is formed above the TFT substrate, the TFT substrate being bonded to the counter substrate by way of a seal member located at a substrate periphery,
    wherein a first alignment film is formed in the display region of the TFT substrate, and a second alignment film is formed at the peripheral region outside of the display region,
    a thickness of the second alignment film is thicker than the thickness of the first alignment film, and
    a black matrix is formed on the counter substrate, the black matrix is formed in a region which overlaps with the second alignment film,
    wherein the second alignment film is in contact with the seal member.

2. The liquid crystal display device according to claim 1, wherein the liquid crystal display device is an IPS mode.

3. The liquid crystal display device according to claim 1, wherein the liquid crystal display device is a TN mode.

4. A liquid crystal display device including a TFT substrate having a display region and a peripheral region, the display region having pixels arranged in a matrix, each pixel having a pixel electrode and a TFT; and a counter substrate opposed to the TFT substrate, the counter substrate having a color filter formed at a position corresponding to a position at which the pixel electrode is formed above the TFT substrate, the counter substrate having a display region and a peripheral region, the TFT substrate being bonded to the counter substrate by way of a seal member located at the periphery,
    wherein a first alignment film is formed in the display region of the TFT substrate, and a second alignment film is formed at the peripheral region outside of the display region,
    a thickness of the second alignment film is thicker than the thickness of the first alignment film,
    a third alignment film is formed in the display region of the counter substrate, a fourth alignment film is formed at the peripheral region outside of the display region, and
    a thickness of the fourth alignment film is thicker than the thickness of the third alignment film,
    wherein the second and the fourth alignment film are in contact with the seal member.

5. The liquid crystal display device according to claim 4, wherein the liquid crystal display device is an IPS mode.

6. The liquid crystal display device according to claim 4, wherein the liquid crystal display device is a TN mode.

* * * * *